United States Patent
Cheng

(10) Patent No.: US 12,538,766 B2
(45) Date of Patent: Jan. 27, 2026

(54) COMPOSITE SUBSTRATE AND PREPARATION METHOD THEREOF, AND SEMICONDUCTOR DEVICE STRUCTURE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 167 days.

(21) Appl. No.: 18/328,143

(22) Filed: Jun. 2, 2023

(65) Prior Publication Data

US 2024/0297069 A1  Sep. 5, 2024

(30) Foreign Application Priority Data

Mar. 2, 2023  (CN) .......................... 202310193258.7

(51) Int. Cl.
| | |
|---|---|
| *H01L 21/762* | (2006.01) |
| *C23C 14/06* | (2006.01) |
| *C23C 14/48* | (2006.01) |
| *C23C 16/34* | (2006.01) |
| *C30B 23/02* | (2006.01) |

(Continued)

(52) U.S. Cl.
CPC .... *H01L 21/76251* (2013.01); *C23C 14/0641* (2013.01); *C23C 14/48* (2013.01); *C23C 16/34* (2013.01); *C30B 23/02* (2013.01); *C30B 25/02* (2013.01); *C30B 29/403* (2013.01); *C30B 31/22* (2013.01); *H01L 21/02167* (2013.01); *H01L 21/0217* (2013.01); *H01L 21/02178* (2013.01); *H01L 21/022* (2013.01);
(Continued)

(58) Field of Classification Search
None
See application file for complete search history.

(56) References Cited

U.S. PATENT DOCUMENTS 10,483,386 B2 * 11/2019 Chen .................. H10D 30/4755
2009/0057646 A1 * 3/2009 Hirayama ........ H10H 20/01335
438/46

(Continued)

FOREIGN PATENT DOCUMENTS

CN          101771121 A  *  7/2010

*Primary Examiner* — Seth Dumbris
(74) *Attorney, Agent, or Firm* — Westbridge IP LLC

(57) ABSTRACT

A composite substrate includes a substrate, a high-resistance layer located on the substrate, the high-resistance layer comprising a first low-temperature aluminum nitride (AlN) layer, a high-temperature AlN layer and a second low-temperature AlN layer which are stacked in sequence, and a growth substrate located on a side, away from the substrate, of the high-resistance layer. Under the action of the first low-temperature AlN layer, a tensile stress on the high-temperature AlN layer may be reduced, to reduce a dislocation, and further improve a crystal quality of the high-temperature AlN layer and ensure resistivity of the high-temperature AlN layer; and an element of Al in the high-temperature AlN layer is prevented from diffusing into the growth substrate, to protect the crystal quality of the high-temperature AlN layer and improve a bonding effect between the high-resistance layer and the growth substrate. Thus, stability and reliability of the composite substrate are greatly improved.

20 Claims, 3 Drawing Sheets

(51) Int. Cl.
  *C30B 25/02*  (2006.01)
  *C30B 29/40*  (2006.01)
  *C30B 31/22*  (2006.01)
  *H01L 21/02*  (2006.01)
  *H10D 62/80*  (2025.01)

(52) U.S. Cl.
  CPC .. *H01L 21/02351* (2013.01); *H01L 21/02356* (2013.01); *H10D 62/80* (2025.01)

(56) References Cited

U.S. PATENT DOCUMENTS

| | | | |
|---|---|---|---|
| 2010/0193843 A1* | 8/2010 | Lee | H01L 21/02505 |
| | | | 257/E29.091 |
| 2014/0001439 A1* | 1/2014 | Chen | H10D 62/8503 |
| | | | 257/E29.091 |
| 2014/0191240 A1* | 7/2014 | Chiang | H01L 21/31111 |
| | | | 438/285 |
| 2016/0027643 A1* | 1/2016 | Bridger | H10H 20/811 |
| | | | 438/478 |
| 2018/0053647 A1* | 2/2018 | Fukazawa | H01L 21/02447 |
| 2019/0051516 A1* | 2/2019 | Lee | H01L 21/02433 |

* cited by examiner

COMPOSITE SUBSTRATE AND PREPARATION METHOD THEREOF, AND SEMICONDUCTOR DEVICE STRUCTURE

CROSS-REFERENCE TO RELATED APPLICATIONS

The present application claims priority to Chinese Patent Application No. 202310193258.7, filed on Mar. 2, 2023, the entire contents of which are incorporated herein by reference.

TECHNICAL FIELD

The present application relates to the field of semiconductor technologies, and in particular, to a composite substrate and a preparation method thereof, and a semiconductor device structure.

BACKGROUND

Silicon on Insulator (SOI) circuits have advantages of high speed, low power consumption, radiation resistance, and the like, and have important application backgrounds in aspects of aerospace, military electronics, portable communication systems, and the like, and are more attention to people.

SUMMARY

According to one aspect of the present application, a composite substrate is provided, including: a substrate; a high-resistance layer located on the substrate, the high-resistance layer including a first low-temperature aluminum nitride (AlN) layer, a high-temperature AlN layer, and a second low-temperature AlN layer which are stacked in sequence; and a growth substrate located on a side, away from the substrate, of the high-resistance layer.

Optionally, materials of the first low-temperature AlN layer, the high-temperature AlN layer and the second low-temperature AlN layer are single crystal AlN.

Optionally, the high-resistance layer is an ion doping layer, and a doped ion includes at least one of arsenic, helium, argon, aluminum, phosphorus, nitrogen, oxygen, carbon, and iron.

Optionally, the high-resistance layer is an ion doping layer, and a doped ion includes at least one of boron, beryllium, and magnesium.

Optionally, the composite substrate further includes an insertion layer, the insertion layer is located on a side, close to the high-resistance layer, of the substrate; and/or the insertion layer is located on a side, close to the high-resistance layer, of the growth substrate.

Optionally, a material of the insertion layer includes at least one of silicon carbide SiC and SiCAlN alloys.

Optionally, the composite substrate further includes a dielectric layer, and the dielectric layer is located on a side, close to the growth substrate, of the high-resistance layer.

Optionally, a material of the dielectric layer includes at least one of SiN, $SiO_2$, SiON, and $Al_2O_3$.

According to another aspect of the present application, a preparation method of a composite substrate is provided, including: providing a substrate; forming a high-resistance layer on the substrate, sequentially including a first low-temperature AlN layer formed in a low-temperature environment, a high-temperature AlN layer formed in a high-temperature environment, and a second low-temperature AlN layer formed in a low-temperature environment; and providing a growth substrate, and bonding the growth substrate to a side, away from the substrate, of the high-resistance layer.

Optionally, materials of the first low-temperature AlN layer, the high-temperature AlN layer and the second low-temperature AlN layer are single crystal AlN.

Optionally, the preparation method further includes: performing ion implantation on the high-resistance layer to destroy lattice of the high-resistance layer, and an ion used by the ion implantation includes at least one of arsenic, helium, argon, aluminum, phosphorus, nitrogen, oxygen, carbon, and iron.

Optionally, the preparation method further includes: performing ion implantation on the high-resistance layer to perform compensation doping on the high-resistance layer, and an ion used by the ion implantation includes at least one of boron, beryllium, and magnesium.

Optionally, the preparation method further includes: forming, before forming a high-resistance layer on the substrate, an insertion layer on the substrate, and forming the high-resistance layer on the insertion layer; and/or forming, before bonding the growth substrate to a side, away from the substrate, of the high-resistance layer, the insertion layer on the growth substrate, and forming the insertion layer between the high-resistance layer and the growth substrate.

Optionally, a preparation method of the insertion layer includes: carbonizing a surface of the substrate to form the insertion layer on the surface of the substrate; and/or carbonizing a surface of the growth substrate to form the insertion layer on the surface of the growth substrate.

Optionally, a preparation method of the insertion layer includes: epitaxially preparing the insertion layer on the substrate; and/or epitaxially preparing the insertion layer on the growth substrate.

Optionally, after forming a high-resistance layer on the substrate and before bonding the growth substrate to a side, away from the substrate, of the high-resistance layer, the preparation method further includes: depositing a dielectric layer on the high-resistance layer, and bonding the growth substrate to the dielectric layer.

Optionally, after depositing a dielectric layer on the high-resistance layer, the preparation method further includes: performing chemical mechanical polishing on a side, away from the substrate, of the dielectric layer to enhance bonding strength between the dielectric layer and the growth substrate.

According to another aspect of the present application, a semiconductor device structure is provided, including the composite substrate as described above.

According to the composite substrate and the preparation method thereof, and the semiconductor device structure provided by embodiments of the present application, technical effects may be generated as follows.

The first low-temperature AlN layer is formed on a substrate, so that a tensile stress borne on the high-temperature AlN layer may be reduced, to eliminate a hole in the high-temperature AlN layer and reduce a dislocation in the high-temperature AlN layer, and further improve a crystal quality of the high-temperature AlN layer and ensure resistivity of the high-temperature AlN layer. Since the second low-temperature AlN layer is formed on the high-temperature AlN layer, the second low-temperature AlN layer serves as a protective layer of the high-temperature AlN layer, so that an element of Al in the high-temperature AlN layer is prevented from diffusing into the growth substrate, to protect the crystal quality of the high-temperature AlN layer. In addition, the second low-temperature AlN layer is bonded to the growth substrate, to improve a bonding effect between the high-resistance layer and the growth substrate, and further enhance mechanical strength of the composite substrate and greatly improve stability and reliability of the composite substrate.

In addition, compared with oxide buried oxide layers of a traditional SOI, in the high-resistance layer, the single crystal AlN, as an excellent insulating material, has ability to form thermodynamically stable contact with an element of Si, and there is a lower interface state density and leakage current between the single crystal AlN and the element of Si; compared with the oxide buried oxide layers of the traditional SOI, the single crystal AlN has a higher thermal conductivity, and heat dissipation capability of the composite substrate is improved, to ensure that a device formed on the composite substrate can work in a high-temperature environment; and an AlN material has higher anti-radiation performance, to ensure that the device formed on the composite substrate may work stably in a high-power and irradiation environment.

BRIEF DESCRIPTION OF THE DRAWINGS

Embodiments of the present application are described in more detail with reference to accompanying drawings, and above and other objects, features and advantages of the present application become more apparent. The drawings are used to provide a further understanding of the embodiments of the present application, constitute a part of the specification, are used to explain the present application together with the embodiments of the present application, and do not constitute a limitation on the present application. In the drawings, like reference numerals generally represent the same components or steps.

DETAILED DESCRIPTION OF THE EMBODIMENTS

The technical solutions in the embodiments of the present application are described hereinafter clearly and completely, with reference to accompanying drawings in the embodiments of the present application. Apparently, the described embodiments are only a part, but not all, of the embodiments of the present application. All of the other embodiments that are obtained by those of ordinary skill in the art based on the embodiments in the application without any inventive efforts fall into the scope protected by the present application.

At present, $SiO_2$ is used as an insulating layer in SOI. Due to poor thermal conductivity of the $SiO_2$, a heat flow barrier of a device made of an SOI substrate is formed, so that application of the SOI in a high-temperature and large-power-consumption circuit is limited to a great extent, and performance and possible service life of the device are reduced to a certain extent. In a current application of the SOI substrate in a field of radio frequency, a parasitic circuit may be formed in a substrate due to a transmission of a radio frequency signal in a device layer, and therefore, crosstalk from the substrate may be generated. As a frequency increases, crosstalk effect becomes more and more obvious. A high-resistance substrate is usually adopted to improve impedance of the parasitic circuit, to reduce the crosstalk. However, a surface parasitic phenomenon is caused by adopting the high-resistance substrate, to form a parasitic capacitance, so that a signal loss of a device circuit is easily caused. Furthermore, due to an influence of an electric field generated by the radio frequency signal in the device layer, an inversion layer may be formed on a surface region, close to an insulating layer, of a bottom substrate in the SOI, and a carrier flows in the inversion layer, so that a high-resistance characteristic of the substrate is weakened.

Embodiment 1

Figure 1:
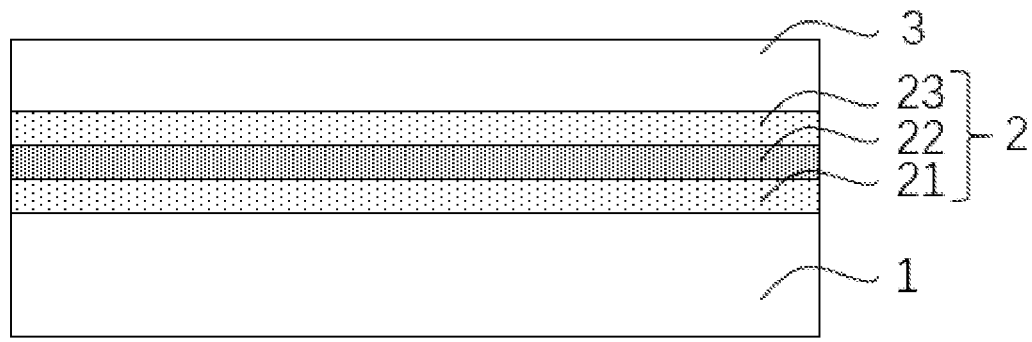
FIG. 1 is a schematic structural diagram of a composite substrate according to an embodiment 1 of the present application.

A composite substrate and a preparation method thereof are disclosed in the embodiment 1. FIG. 1 shows a schematic structural diagram of the composite substrate according to the embodiment 1 of the present application. As shown in FIG. 1, the composite substrate includes a substrate 1, a high-resistance layer 2 located on the substrate 1, the high-resistance layer 2 including a first low-temperature AlN layer 21, a high-temperature AlN layer 22 and a second low-temperature AlN layer 23 which are stacked in sequence, and a growth substrate 3 bonded to a side, away from the substrate 1, of the high-resistance layer 2.

Materials of the first low-temperature AlN layer 21, the high-temperature AlN layer 22 and the second low-temperature AlN layer 23 are single crystal AlN. In the embodiment, materials of the substrate 1 and the growth substrate 3 are Si, the material of the growth substrate 3 is Si (111), and the material of the substrate 1 is Si (100).

The first low-temperature AlN layer 21 is formed on the substrate 1, so that a tensile stress borne on the high-temperature AlN layer 22 may be reduced and a hole in the high-temperature AlN layer 22 is eliminated, to reduce a dislocation in the high-temperature AlN layer 22, and further improve a crystal quality of the high-temperature AlN layer 22 and ensure resistivity of the high-temperature AlN layer 22. Since the second low-temperature AlN layer 23 is formed on the high-temperature AlN layer 22, the second low-temperature AlN layer serves as a protective layer of the high-temperature AlN layer 22, so that an element of Al in the high-temperature AlN layer 22 is prevented from diffusing into the growth substrate 3, to protect the crystal quality of the high-temperature AlN layer 22. In addition, the second low-temperature AlN layer 23 is bonded to the growth substrate 3, to improve a bonding effect between the high-resistance layer 2 and the growth substrate 3, and further improve mechanical strength and reliability of the composite substrate.

In addition, compared with oxide buried oxide layers of a traditional SOI, in the high-resistance layer 2, the single crystal AlN, as an excellent insulating material, has ability to form thermodynamically stable contact with an element of Si, and there is a lower interface state density and leakage current between the single crystal AlN and the element of Si; compared with the oxide material buried oxide layers of the traditional SOI, the single crystal AlN has a higher thermal conductivity, and heat dissipation capability of the composite substrate is improved, to ensure that a device formed on the composite substrate may work in a high-temperature environment; and an AlN material has higher anti-radiation performance, to ensure that the device formed on the composite substrate may work stably in a high-power and irradiation environment.

Optionally, the high-resistance layer 2 is an ion doping layer, and a doped ion includes at least one of boron, arsenic, helium, beryllium, magnesium, argon, aluminum, phosphorus, nitrogen, oxygen, carbon, and iron. A dopant concentration of one or more doped ions may be between about $1 \times 10^{15}$ cm$^{-3}$ and about $1 \times 10^{19}$ cm$^{-3}$, or in some embodiments, between about $5 \times 10^{15}$ cm$^{-3}$ and about $1 \times 10^{18}$ cm$^{-3}$, and other higher or lower concentrations may alternatively be used. A suitable ion is implanted into the high-resistance layer 2, optionally, the doped ion in the high-resistance layer 2 may be at least one of arsenic, helium, argon, aluminum, phosphorus, nitrogen, oxygen, carbon, and iron, which may destroy lattice of the high-resistance layer 2, so that the lattice of the high-resistance layer 2 is distorted and periodicity of lattice potential field is destroyed, to increase electron scattering probability and increase resistivity, and further improve the reliability of the composite substrate. In another embodiment, the doped ion in the high-resistance layer 2 may be at least one of boron, beryllium, and magnesium, to introduce a compensating dopant into the high-resistance layer 2, so that resistance of the high-resistance layer 2 is prevented from being reduced due to doping, to ensure the resistivity of the high-resistance layer 2.

A preparation method of a composite substrate disclosed in the embodiment 1 includes:

providing a substrate 1;

forming a high-resistance layer 2 on the substrate 1, sequentially including a first low-temperature AlN layer 21 formed in a low-temperature environment, a high-temperature AlN layer 22 formed in a high-temperature environment, and a second low-temperature AlN layer 23 formed in a low-temperature environment; and providing a growth substrate 3, and bonding the growth substrate 3 to a side, away from the substrate 1, of the high-resistance layer 2.

A preparation method of the high-resistance layer 2 includes Physical Vapor Deposition (PVD) or Metal-Organic Chemical Vapor Deposition (MOCVD). Materials of the first low-temperature AlN layer, the high-temperature AlN layer and the second low-temperature AlN layer are single crystal AlN. In the embodiment, materials of the substrate 1 and the growth substrate 3 are Si, the material of the growth substrate 3 is Si (111), and the material of the substrate 1 is Si (100).

Optionally, the preparation method of the composite substrate further includes performing ion implantation on the high-resistance layer 2, and an ion includes at least one of boron, arsenic, helium, beryllium, magnesium, argon, aluminum, phosphorus, nitrogen, oxygen, carbon, and iron. Optionally, the ion implantation is performed on the high-resistance layer 2, and the doped ion in the high-resistance layer 2 may be at least one of arsenic, helium, argon, aluminum, phosphorus, nitrogen, oxygen, carbon, and iron, to destroy lattice of the high-resistance layer 2, so that the lattice of the high-resistance layer 2 is distorted and periodicity of lattice potential field is destroyed, to increase electron scattering probability and increase resistivity, and further improve the reliability of the composite substrate. In another embodiment, the doped ion in the high-resistance layer 2 may be at least one of boron, beryllium, and magnesium, to introduce a compensating dopant into the high-resistance layer 2, so that resistance of the high-resistance layer 2 is prevented from being reduced due to doping, to ensure the resistivity of the high-resistance layer 2.

Embodiment 2

Figure 2:
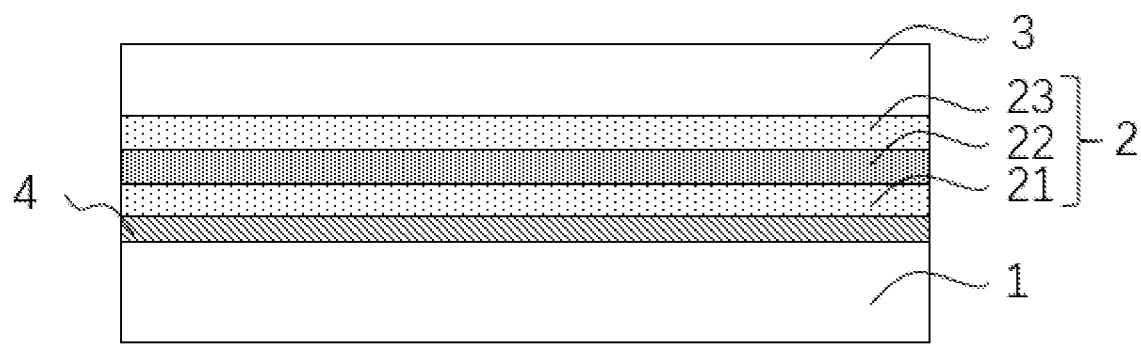
FIG. 2 to FIG. 4 are schematic structural diagrams of a composite substrate according to an embodiment 2 of the present application.
Figure 3:
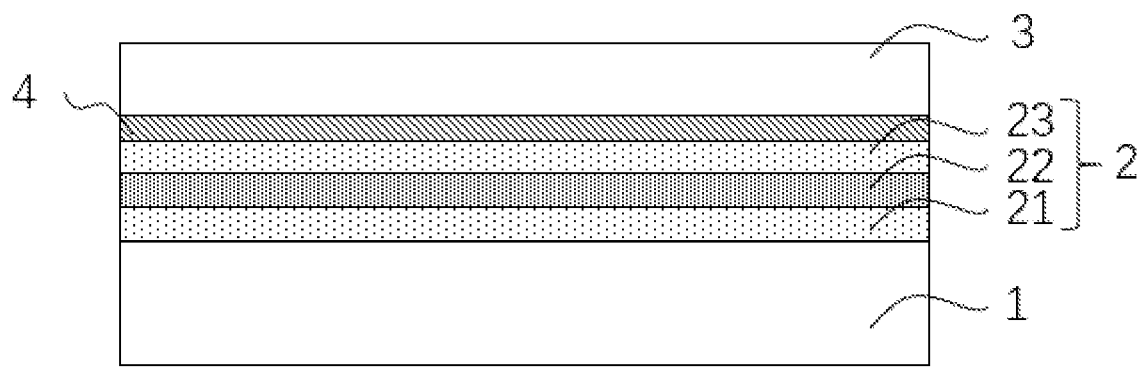
Figure 4:
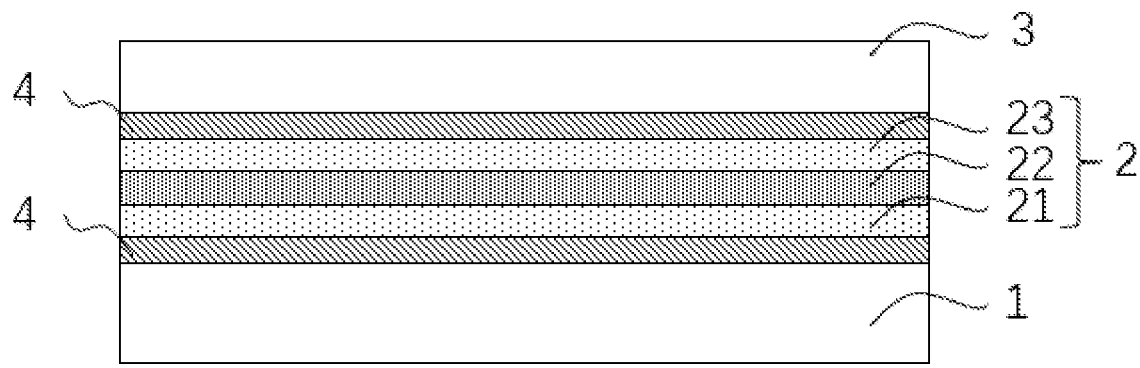
Figure 5:
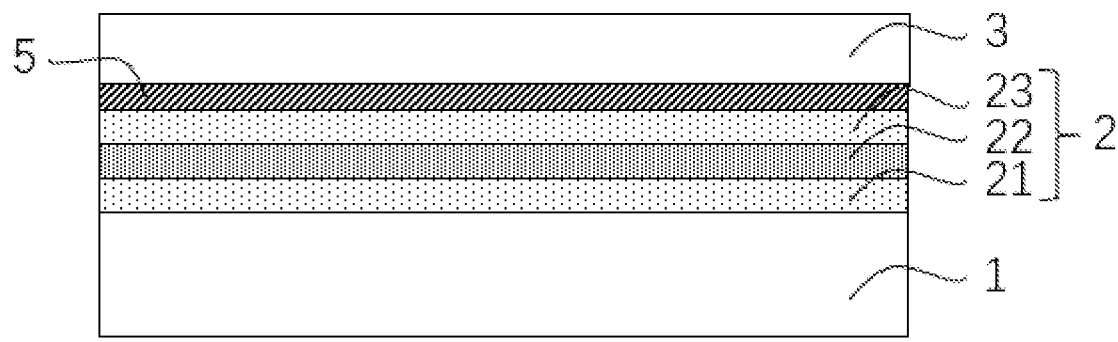
FIG. 5 to FIG. 8 are schematic structural diagrams of a composite substrate according to an embodiment 3 of the present application.
Figure 6:
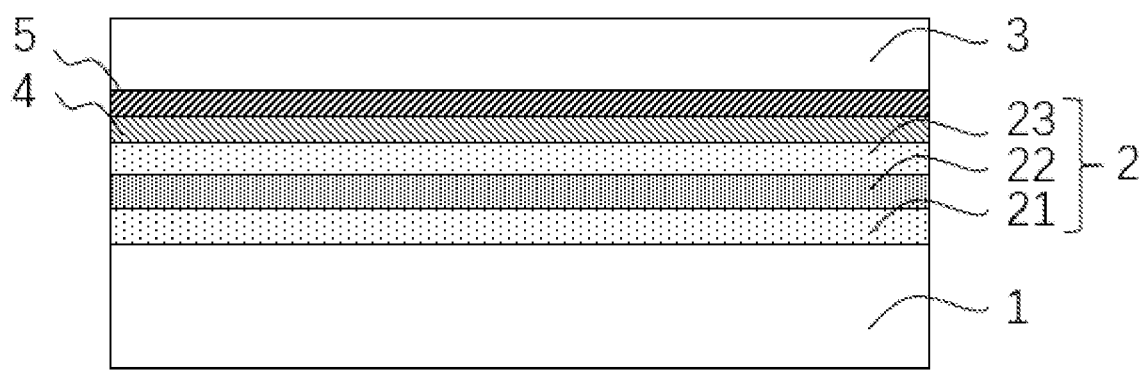
Figure 7:
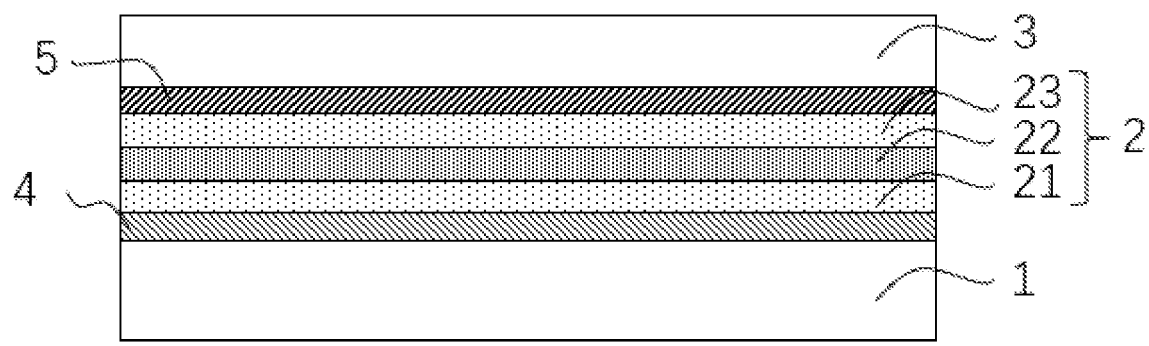
Figure 8:
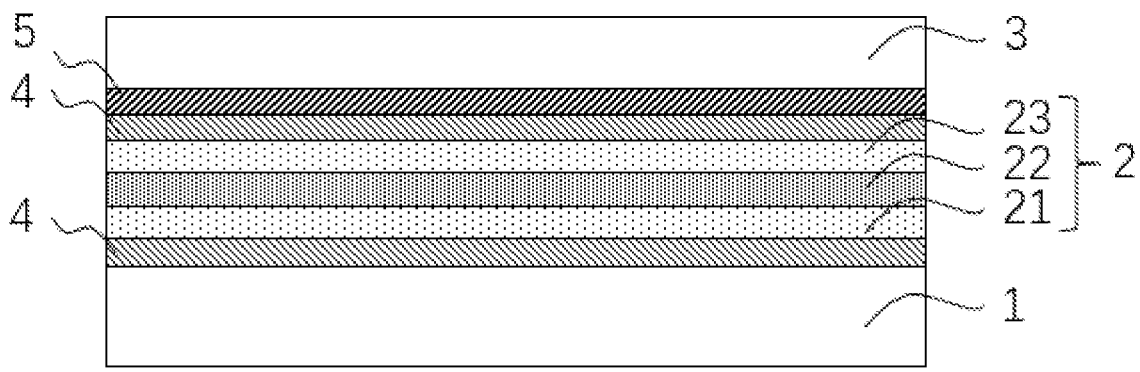

FIG. 2 to FIG. 4 are schematic structural diagrams of a composite substrate according to the embodiment 2 of the present application. Referring to FIG. 2 to FIG. 4, the composite substrate and the preparation method thereof disclosed in the embodiment 2 is approximately the same as those of the embodiment 1. The difference between the two lies in that the composite substrate according to the embodiment 2 further includes an insertion layer 4. Optionally, the insertion layer 4 is located on a side, close to the high-resistance layer 2, of the substrate 1; or the insertion layer 4 is located on a side, close to the high-resistance layer 2, of the growth substrate 3; or the insertion layer 4 is disposed both on the side, close to the high-resistance layer 2, of the substrate 1 and the side, close to the high-resistance layer 2, of the growth substrate 3. A material of the insertion layer 4 includes at least one of SiC and SiCAlN alloys.

A dielectric constant of the insertion layer 4 is similar to that of the high-resistance layer 2, which may reduce interface leakage, improve a high-resistance characteristic of the composite substrate, and avoid a parasitic circuit formed in the composite substrate due to transmission of a radio frequency signal, so that crosstalk of the composite substrate on the radio frequency signal is suppressed. Furthermore, under the action of the insertion layer 4, charge storage at an interface between the high-resistance layer 2 and the substrate 1 and at an interface between the high-resistance layer 2 and the growth substrate 3 are reduced, to avoid a surface parasitic phenomenon, and further avoid a parasitic capacitance formed on a surface and a signal loss of a device circuit formed on the composite substrate. In addition, under the action of the insertion layer 4, bonding strength between the growth substrate 3 and the high resistance layer 2 is further enhanced.

A preparation method of a composite substrate disclosed in the embodiment 2 is approximately the same as that of the embodiment 1. The difference between the two lies in that before the high-resistance layer 2 is formed on the substrate 1, an insertion layer 4 is formed on the substrate 1, and the high-resistance layer 2 is formed on the insertion layer 4; and/or, before the growth substrate 3 is bonded to a side, away from the substrate 1, of the high-resistance layer 2, an insertion layer 4 is formed on the growth substrate 3, and the insertion layer 4 is disposed between the high-resistance layer 2 and the growth substrate 3. A material of the insertion layer includes at least one of SiC and SiCAlN alloys.

A preparation method of the insertion layer 4 includes: carbonizing a surface of the substrate 1 and/or a surface of the growth substrate 3, to form the insertion layer 4 on the surface of the substrate 1 and/or the surface of the growth substrate 3; or epitaxially preparing the insertion layer on the substrate 1 and/or the growth substrate 3.

Embodiment 3

FIG. 5 to FIG. 8 are schematic structural diagrams of a composite substrate according to the embodiment 3 of the present application. Referring to FIG. 5 to FIG. 8, the composite substrate and the preparation method thereof disclosed in the embodiment 3 is approximately the same as those of the embodiment 1 or those of the embodiment 2. The difference lies in that the composite substrate disclosed in the embodiment 3 further includes a dielectric layer 5, and the dielectric layer 5 is located on a side, close to the growth substrate 3, of the high-resistance layer 2.

Optionally, a material of the dielectric layer 5 includes at least one of SiN, $SiO_2$, SiON, and $Al_2O_3$.

Under the action of the dielectric layer 5, an element of Al in the high-resistance layer 2 may be further prevented from diffusing into the growth substrate 3, so that a crystal quality of the AlN is improved, and resistivity of the growth substrate 3 is prevented from being decreased due to diffusion of the element of Al in the high-resistance layer 2. Moreover, the dielectric layer 5 itself is insulated, and resistivity of the composite substrate may further be improved.

The preparation method of the composite substrate disclosed in the embodiment 3 is approximately the same as that of the embodiment 1 or that of the embodiment 2. The difference lies in that after the high-resistance layer 2 is formed on the substrate 1, and before the growth substrate 3 is bonded to a side, away from the substrate 1, of the high-resistance layer 2, a dielectric layer 5 is deposited on the high-resistance layer 2, and the growth substrate 3 is bonded to the dielectric layer 5. A material of the dielectric layer 5 includes at least one of SiN, $SiO_2$, SiON, and $Al_2O_3$.

Optionally, after the dielectric layer 5 is deposited on the high-resistance layer 2, and before the growth substrate 3 is bonded to the side, away from the substrate 1, of the high-resistance layer 2, chemical mechanical polishing is performed on a surface of a side, away from the substrate 1, of the dielectric layer 5, to enhance bonding strength between the dielectric layer 5 and the growth substrate 3, and ensure reliability of the composite substrate.

The foregoing description is presented for purposes of illustration and description. In addition, the description is not intended to limit the embodiments of the present application to the forms disclosed herein. Although multiple example aspects and embodiments have been discussed above, those skilled in the art may recognize certain variations, modifications, changes, additions, and sub-combinations thereof.

What is claimed is:

1. A composite substrate, comprising:
    a substrate;
    a high-resistance layer located on the substrate, the high-resistance layer comprising a first low-temperature aluminum nitride (AlN) layer, a high-temperature AlN layer, and a second low-temperature AlN layer which are stacked in sequence; and
    a growth substrate bonded to a side, away from the substrate, of the high-resistance layer,
    wherein materials of the substrate and the growth substrate are Si.

2. The composite substrate according to claim 1, wherein materials of the first low-temperature AlN layer, the high-temperature AlN layer and the second low-temperature AlN layer are single crystal AlN;
    the material of the growth substrate is Si (111), and the material of the substrate is Si (100); and
    the second low-temperature AlN layer is bonded to the growth substrate.

3. The composite substrate according to claim 1, wherein the high-resistance layer is an ion doping layer, and a doped ion comprises at least one of arsenic, helium, argon, aluminum, phosphorus, nitrogen, oxygen, carbon, and iron.

4. The composite substrate according to claim 1, wherein the high-resistance layer is an ion doping layer, and a doped ion comprises at least one of boron, beryllium, and magnesium.

5. The composite substrate according to claim 1, further comprising an insertion layer;
    wherein the insertion layer is located on a side, close to the high-resistance layer, of the substrate; and/or
    the insertion layer is located on a side, close to the high-resistance layer, of the growth substrate.

6. The composite substrate according to claim 5, wherein a material of the insertion layer comprises at least one of SiC and SiCAlN alloys.

7. The composite substrate according to claim 1, further comprising a dielectric layer, wherein the dielectric layer is located on a side, close to the growth substrate, of the high-resistance layer.

8. The composite substrate according to claim 7, wherein a material of the dielectric layer comprises at least one of SiN, SiO2, SiON, and Al2O3.

9. A preparation method of a composite substrate, comprising:
    providing a substrate;
    forming a high-resistance layer on the substrate, sequentially comprising a first low-temperature AlN layer formed in a low-temperature environment, a high-temperature AlN layer formed in a high-temperature environment, and a second low-temperature AlN layer formed in a low-temperature environment; and
    providing a growth substrate, and bonding the growth substrate to a side, away from the substrate, of the high-resistance layer,
    wherein materials of the substrate and the growth substrate are Si.

10. The preparation method of the composite substrate according to claim 9, wherein materials of the first low-temperature AlN layer, the high-temperature AlN layer and the second low-temperature AlN layer are single crystal AlN;
    the material of the growth substrate is Si (111), and the material of the substrate is Si (100); and
    the second low-temperature AlN layer is bonded to the growth substrate.

11. The preparation method of the composite substrate according to claim 9, further comprising: performing ion implantation on the high-resistance layer to destroy lattice of the high-resistance layer, wherein an ion used by the ion implantation comprises at least one of arsenic, helium, argon, aluminum, phosphorus, nitrogen, oxygen, carbon, and iron.

12. The preparation method of the composite substrate according to claim 9, further comprising: performing ion implantation on the high-resistance layer to perform compensation doping on the high-resistance layer, wherein an ion used by the ion implantation comprises at least one of boron, beryllium, and magnesium.

13. The preparation method of the composite substrate according to claim 9, further comprising:
    forming, before forming a high-resistance layer on the substrate, an insertion layer on the substrate, and forming the high-resistance layer on the insertion layer; and/or
    forming, before bonding the growth substrate to a side, away from the substrate, of the high-resistance layer, the insertion layer on the growth substrate, and forming the insertion layer between the high-resistance layer and the growth substrate.

14. The preparation method of the composite substrate according to claim 13, wherein a preparation method of the insertion layer comprises:
    carbonizing a surface of the substrate to form the insertion layer on the surface of the substrate; and/or carbonizing a surface of the growth substrate to form the insertion layer on the surface of the growth substrate.

15. The preparation method of the composite substrate according to claim 13, wherein a preparation method of the insertion layer comprises:
epitaxially preparing the insertion layer on the substrate; and/or
epitaxially preparing the insertion layer on the growth substrate.

16. The preparation method of the composite substrate according to claim 9, wherein after forming a high-resistance layer on the substrate and before bonding the growth substrate to a side, away from the substrate, of the high-resistance layer, the preparation method further comprises:
depositing a dielectric layer on the high-resistance layer, and bonding the growth substrate to the dielectric layer.

17. The preparation method of the composite substrate according to claim 16, wherein after depositing a dielectric layer on the high-resistance layer, the preparation method further comprises:
performing chemical mechanical polishing on a side, away from the substrate, of the dielectric layer to enhance bonding strength between the dielectric layer and the growth substrate.

18. A semiconductor device structure, comprising a composite substrate, wherein the composite substrate comprises:
a substrate;
a high-resistance layer located on the substrate, the high-resistance layer comprising a first low-temperature AlN layer, a high-temperature AlN layer, and a second low-temperature AlN layer which are stacked in sequence; and
a growth substrate bonded to side, away from the substrate, of the high-resistance layer,
wherein materials of the substrate and the growth substrate are Si.

19. The semiconductor device structure according to claim 18, wherein materials of the first low-temperature AlN layer, the high-temperature AlN layer and the second low-temperature AlN layer are single crystal AlN;
the material of the growth substrate is Si (111), and the material of the substrate is Si (100); and
the second low-temperature AlN layer is bonded to the growth substrate.

20. The semiconductor device structure according to claim 18, wherein the composite substrate further comprises an insertion layer;
the insertion layer is located on a side, close to the high-resistance layer, of the substrate; and/or
the insertion layer is located on a side, close to the high-resistance layer, of the growth substrate.

* * * * *